(12) United States Patent
Yamazaki

(10) Patent No.: US 7,277,769 B2
(45) Date of Patent: Oct. 2, 2007

(54) PRODUCTION SYSTEM AND METHOD FOR A COMPOSITE PRODUCT

(75) Inventor: Shunpei Yamazaki, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1119 days.

(21) Appl. No.: 10/259,883

(22) Filed: Sep. 30, 2002

(65) Prior Publication Data

US 2003/0063555 A1    Apr. 3, 2003

(30) Foreign Application Priority Data

Oct. 1, 2001 (JP) .............................. 2001-304763

(51) Int. Cl.
 *G06F 19/00* (2006.01)
(52) U.S. Cl. ................... 700/110; 700/121; 700/116
(58) Field of Classification Search ................ 700/110, 700/121, 116; 438/10, 14; 257/E21.525, 257/E21.599, E21.602
See application file for complete search history.

(56) References Cited

U.S. PATENT DOCUMENTS

| 4,459,663 | A |   | 7/1984  | Dye          |        |
|-----------|---|---|---------|--------------|--------|
| 5,219,765 | A | * | 6/1993  | Yoshida et al. | 438/10 |
| 5,360,747 | A | * | 11/1994 | Larson et al. | 438/10 |
| 5,907,492 | A | * | 5/1999  | Akram et al. | 700/121 |
| 5,923,552 | A |   | 7/1999  | Brown et al. |        |

(Continued)

FOREIGN PATENT DOCUMENTS

TW    328612    3/1998

(Continued)

OTHER PUBLICATIONS

Press Release, Toshiba America Electronic Components, Toshiba and Tessera Announce Innovative Technology Licensing Agreement, Jun. 26, 2003, pp. 1-2.

(Continued)

*Primary Examiner*—Leo Picard
*Assistant Examiner*—Steven R. Garland
(74) *Attorney, Agent, or Firm*—Eric J. Robinson; Robinson Intellectual Property Law Office, P.C.

(57) ABSTRACT

To provide a production system which is constituted by a plurality of production facilities forming a production line, in which a work in process undergoes a plurality of processes to be completed as a product, and in which occurrence of a product defect or malfunction due to a contamination at a manufacturing stage of a composite product is prevented to avoid a risk in development of the composite product. First and second production lines are discriminated physically or geometrically or as body corporate, and installed in places remote from each other. In the first production line, a group of first substrates is processed by a first process to form a first device group in each of a plurality of regions into which each first substrate is divided, thereby producing a half-finished product. In the second production line, each first substrate is divided into second substrates, and a group of second substrates is processed by a second process to form a second element group. Each of divisions in each second substrate is separated and is integrated with another constituent member to form a module. A composite product in which this module is incorporated is produced.

26 Claims, 7 Drawing Sheets

U.S. PATENT DOCUMENTS

| | | |
|---|---|---|
| 6,001,671 A | 12/1999 | Fjelstad |
| 6,230,066 B1 | 5/2001 | Sferro et al. |
| 6,314,379 B1 | 11/2001 | Hu et al. |
| 6,453,209 B1 | 9/2002 | Hill et al. |
| 6,555,400 B2 * | 4/2003 | Farnworth et al. ............ 438/10 |
| 2002/0007348 A1 | 1/2002 | Ali et al. |
| 2002/0032493 A1 | 3/2002 | Kadowaki et al. |
| 2002/0052807 A1 | 5/2002 | Han et al. |
| 2003/0063555 A1 | 4/2003 | Yamazaki |
| 2003/0163214 A1 | 8/2003 | Ouchi |

FOREIGN PATENT DOCUMENTS

| | | |
|---|---|---|
| TW | 331650 | 5/1998 |

OTHER PUBLICATIONS

Press Release, Toshiba America Electronic Components, Toshiba Signs Multi-Year, Multi-Billion Dollar Deal with Dell, May 27, 2003, pp. 1-3.

* cited by examiner first production line

| No. | process | formation | apparatus | mask |
|---|---|---|---|---|
| 1 | first insulating film forming | blocking layer | CVD | |
| 2 | amorphous Si film forming | | | |
| 3 | crystallization | | annealing | |
| 4 | photo resist mask forming | | exposure | mask1 |
| 5 | Si etching | active region/identify marker | etching | |
| 6 | inspection between process1 | | inspection | |
| 7 | first doping | | doping | |
| 8 | second insulating film forming | gate insulating film | CVD | |
| 9 | first conductive layer forming | | sputter | |
| 10 | photo resist mask forming | | exposure | mask2 |
| 11 | first conductive layer etching | gate electrode | etching | |
| 12 | inspection between process2 | | inspection | |
| 13 | photo resist mask forming | | exposure | mask3 |
| 14 | second doping | n-type region | doping | |
| 15 | photo resist mask forming | | exposure | mask4 |
| 16 | third doping | p-type region | doping | |
| 17 | third insulating film forming | protective film | CVD | |
| 18 | active treatment | | annealing | |
| 19 | fourth insulating film forming | interlayer insulating film | coater | |
| 20 | photo resist mask forming | | exposure | mask5 |
| 21 | contact hole forming | | etching | |
| 22 | inspection between process3 | | inspection | |
| 23 | second conductive layer forming | | sputter | |
| 24 | photo resist mask forming | | exposure | mask6 |
| 25 | second conductive layer etching | wiring line | etching | |
| 26 | third conductive layer forming | | sputter | |
| 27 | photo resist mask forming | | exposure | mask7 |
| 28 | third conductive layer etching | picture element electrode1 | etching | |
| 29 | inspection between process4 | | inspection | |
| 30 | fifth insulating film forming | element separation film | coater | |
| 31 | protective film forming | electrostatic ptotective film | coater | |
| 32 | shipping inspection | | inspection | |
| 33 | package | | | |

Fig.5 second production line

| No. | process | formation | apparatus | mask |
|---|---|---|---|---|
| 1 | arrival inspection | | inspection | |
| 2 | division | | scriber | |
| 3 | protective film removal | | cleaning | |
| 4 | organic compound film forming | function region | deposition | shadow mask |
| 5 | fourth conductive layer etching | picture element electrode2 | deposition | shadow mask |
| 6 | sixth insulating film forming | protective film forming | sputtering | |
| 7 | inspection between process5 | | inspection | |
| 8 | end-sealing | end-sealing material | end-sealing | |
| 9 | terminal furnishing | FPC | bonding | |
| 10 | external circuit connection | active/control circuit | assemble | |
| 11 | inspection between process6 | | inspection | |
| 12 | box fornishing | | fabrication device | |
| 13 | package | | | |

Fig. 6

PRODUCTION SYSTEM AND METHOD FOR A COMPOSITE PRODUCT

BACKGROUND OF THE INVENTION

1. Field of the Invention

The present invention relates to a production system and a production method for a product in which a work in process undergoes processing in multiple steps to be completed as a product. More particularly, the present invention relates to a production system and a production method for a composite product such as an electronic appliance in which element groups each constituted by a plurality of members are combined.

2. Description of the Related Art

A product constituted by a semiconductor integrated circuit such as a well-known very-large-scale integrated circuit (VLSI) is completed as a result of multiple steps. As a system for producing such a product, a production system called a job shop system is used in which manufacturing apparatuses of one kind are arranged in one place in a factory and other apparatuses are arranged in the same manner to form facility groups, and a work in process is moved from one facility group to another to be finished as a product. This production system has such characteristics as to enable simultaneous production of a number of different kinds of product and changing of kinds of product and to frequently change the manufacturing process for the purpose of improving yields, stabilizing qualities and improving functions.

A semiconductor integrated circuit is manufactured by performing photolithographic processes in combination with forming of an oxide film or a nitride film, ion implantation and heat treatment, deposition of a metal or semiconductor film, forming of an interlayer insulating film, etc. Several hundred process steps for such processings are required for manufacturing of a VLSI. The term "Design rules" is a generic name for manufacturing process techniques relating to a minimum processing dimension. Ordinarily, design rules specify the gate length or channel length of transistors. A smaller design rule value signifies finer processing. For example, for 64-Mbit dynamic random access memory (DRAM), a process with 0.25 to 0.18 µm is used.

A production line is constituted by a film forming apparatus for forming a coating film, an etching apparatus for etching the film, an exposure apparatus for forming a mask pattern by using a photomask, an annealing apparatus for heat treatment, an industrial robot for conveying substrates, etc. In any production line, a semiconductor is treated with great care so as not to be contaminated by physical contamination with dust or the like, chemical contamination with phosphorous, boron, an organic material gas or the like, or chemical contamination with a metal or alkali metal, such as iron, nickel or sodium, in order to ensure fine accurate processing, high reproducibility and stability of quality. The product line is therefore constructed in a special environment provided in a factory and called a clean room.

To complete a product, multiple steps are executed in predetermined order. Processing in each step proceeds as batch processing or single-wafer processing of a plurality of substrates set as one unit. This unit is called a lot and is treated as a unit in physical distribution in the production system.

As products constituted by a semiconductor device, liquid crystal display devices constructed by forming semiconductor integrated circuits directly on a substrate such as glass, electroluminescent (EL) panels, EL modules, etc., are known as well as memories and microprocessors constructed by forming metal-oxide-semiconductor (MOS) transistors on a semiconductor substrate. Elements forming integrated circuits in liquid crystal display devices use a semiconductor thin film and are therefore called "thin-film transistor (TFT)". A liquid crystal display device is a composite type of product in which a group of elements constituted by TFTs (called a TFT array) and liquid crystal elements each formed in such a structure that a liquid crystal is interposed between a pair of electrodes are combined and the switching characteristic of the TFTs and the electrooptical effect of the liquid crystal are utilized. An EL panel is a composite type of product in which a group of elements constituted by TFTs and EL elements in which an organic compound provided as a light-emitting member is interposed between a pair of electrodes are combined and the switching characteristic of the TFTs and the electroluminescent phenomenon of the EL material are used in combination. An EL module is a composite type of product in which an external circuit such as a controller is added to an EL panel. Each of these products has active elements, i.e., TFTs, arranged in vertical and horizontal directions in matrix form and displays images by using the thus-arranged elements, and is therefore called an active matrix type.

TFTs are produced by semiconductor integrated circuit techniques similar to those for producing VLSI. There is only a small difference therebetween, which is a step of forming a semiconductor film on an insulating surface. It can be said that processing is performed almost in the same manner in other steps, i.e., a gate forming step, an impurity element implantation step, a wiring forming step, etc. An inspection step is incorporated in a TFT process if necessary. The production yield is controlled on the basis of inspection information obtained in the inspection step. The design rules for the above-described display devices use a large minimum dimension of several microns. However, the contamination level allowable in a process for manufacturing the above-described display devices is said to be the same as that in a process for manufacturing the 64-Mbit DRAM.

With composite products each having semiconductor elements and a liquid crystal elements or a light-emitting element constituted by members different in a physical property, which are strictly controlled in a production line, there is a problem in that there is a possibility of one of the two different kinds of element being contaminated by the constituent members of the other to cause a defect. As a specific example, an alkali metal or an alkali earth metal is used in a cathode material in a light-emitting element. If this element contaminates semiconductors, a malfunction of the product may be caused. This contamination not only occurs in the composite product package integrally formed but also appears in an environment surrounding the fabrication line as a secondary contamination to affect the process of producing the product.

As a production means for improving the production efficiency, a method is used in which the size of a substrate on which element groups are formed is increased to enable a larger number of members to be obtained from one substrate. If the size of a substrate is increased, the manufacturing apparatus and the line constituting the manufacturing apparatus are increased. However, if the processing time per substrate is not largely changed, the production capacity is increased. However, the method of increasing the substrate size cannot be simply used for reasons relating to the construction of the apparatus with respect to processings such as coating film formation and etching.

With the increase in variety of products required on the market, a need has arisen to form a production system with flexibility to meet a demand for wide-variety small-lot production. However, conventional lot-by-lot production systems cannot always be formed with flexibility to meet such a demand. With conventional lot-by-lot production systems, there is a problem in that if the size of a substrate is increased to increase the number of members taken from the substrate, an excessively large number of products are produced or the number of substrates in one lot is reduced and production cannot be performed with efficiency.

It is important to acquire increased market share and to maintain its advantage on the market by advancing the development of techniques in forefront of technology for producing as information devices composite products using a combination of semiconductor elements and a liquid crystal element or a combination of semiconductor elements and a light-emitting element, and by manufacturing and selling products protected by intellectual property rights ahead of all competitors. However, an enormous capital and payload are required for manufacturing and selling a completed product involving designing of composite products, designing of processes, designing and optimization of manufacturing apparatuses, optimization of manufacturing conditions, accumulation of know-how, etc., and, on the other hand, there is a risk of getting behind some other company in technological development. The risk is doubled in the electronic device market where commodities are changed in short cycles. A combination of an element substrate on which a semiconductor element is formed and a liquid crystal element or a combination of semiconductor elements and a light-emitting element apparently seems to be simple. However, the circuit configurations, the drive methods, the drive conditions, etc., therefor differ from each other, and the optimum element structures in the semiconductor elements are not the same.

SUMMARY OF THE INVENTION

In view of the above-described problems, an object of the present invention is to provide a production system which is constituted by a plurality of production facilities forming a production line, in which a work in process undergoes multiple steps to be completed as a product, which is arranged so that occurrence of a product defect or malfunction due to a contamination at a manufacturing stage of a composite product is prevented and so that productivity of each component before the components are combined is maximized, and which is therefore effective in avoiding a risk in development of the composite product.

To achieve the above-described object, according to one aspect of the present invention, there is provided a production system which has a plurality of production facilities constituting production lines, and in which a composite product is produced as a result of a plurality of processes. The production system has at least a first production line formed by a plurality of production facilities, and a second production line formed by a plurality of production facilities, the first and second production lines being discontinuous with each other, the first and second production lines being installed in places remote from each other. In this production system in which a composite product is manufactured by the plurality of production lines, interrelated information is shared between the production lines. More specifically, the first production line is provided with a first manufacturing apparatus group formed by a plurality of manufacturing apparatuses, and first production control means for performing production control or progress control. The first production control means has first storage means for storing first quality information or characteristic information about a first element group formed on a first substrate in the first manufacturing apparatus group. The second production line is provided with a second manufacturing apparatus group formed by a plurality of manufacturing apparatuses, and second production control means for performing production control or progress control. The first substrate is divided into second substrates. The second production control means has second storage means for storing second quality information or characteristic information about a second element group formed on each second substrate in the second manufacturing apparatus group, or third quality information or product information relating to a state where the first element group and the second element group are combined. The first production control means and the second production control means or the first storage means and the second storage means are capable of communicating with each other. The first quality information or characteristic information and the second quality information or characteristic information or the third quality information or product information are collated with each other to ascertain an address of a division identified as a nondefective in the second substrates. In the above-described arrangement of the present invention, the first production line is formed on the basis of a production method licensed from a first patent holder, and the second production line is formed on the basis of a production method licensed from a second patent holder.

According to another aspect of the present invention, there is provided a production method in which a first production line and a second production line each constituted by a plurality of facilities are provided, and in which a product is produced as a result of a plurality of processes. The first production line and the second production line are physically or geometrically discriminated from each other or discriminated as bodies corporate from each other, and are provided in places or regions remote from each other. In the first production line, works in process or half-finished products are produced in such a manner that a group of first substrates is treated as a first lot and processed by a first process to form a first element group in each of a plurality of regions into which each first substrate is divided. Also, first quality information or characteristic information about a first element group formed on each first substrate between particular process steps in the first process is collected. In the second production line, each first substrate is divided into second substrates, and a group formed by some of the second substrates is treated as a second lot and processed by a second process to form a second element group in correspondence with each of a plurality of regions into which each second substrate is divided. Second quality information or characteristic information about the second element group or third quality information or product information about a state of the first element group and the second element group in which the first and second element groups are combined with each other between particular process steps in the second process is collected. The first quality information or characteristic information and the second quality information or characteristic information or the third quality information or product information are collated with each other to form information indicating addresses of some of the divisions identified as a nondefective in the second substrates. Each division is separated from the second substrates to form a unit functional member. Only functional members recognized as a nondefective from the information indicating the addresses are selected. Each selected functional member and at least one constituent member other than the functional member are combined into a module. A composite product in which this module is incorporated is produced.

According to still another aspect of the present invention, there is provided a production method in which a first production line and a second production line each constituted by a plurality of facilities are provided, and in which a product is produced as a result of a plurality of processes. In the first production line, works in process or half-finished products are produced in such a manner that a first identifier is attached to each of first substrates; a group of some of the first substrates is accommodated in a carrier; a second identifier for identification of the group of first substrates is attached to the carrier; and, in each of a plurality of regions into which each first substrate is divided, a first element group is formed by a process under certain processing conditions programmed according to the first and second identifiers. Also, first quality information or characteristic information about the first element group formed on each first substrate between particular process steps in the first process is collected by being related to the first identifier. In the second production line, each first substrate is divided into second substrates, and a group formed by some of the second substrates is treated as a second lot and processed by a second process to form a second element group in correspondence with each of a plurality of regions into which each second substrate is divided. Second quality information or characteristic information about the second element group or third quality information or product information about a state of the first element group and the second element group in which the first and second element groups are combined with each other between particular process steps in the second process is collected. The first quality information or characteristic information and the second quality information or characteristic information or the third quality information or product information are collated with each other. Information indicating addresses of some of the divisions identified as a nondefective in the second substrates is formed. Each division is separated from the second substrates to form a unit functional member. Only functional members recognized as a nondefective from the information indicating the addresses are selected. Each selected functional member and at least one constituent member other than the functional member are combined into a module. A composite product in which this module is incorporated is produced.

According to a further aspect of the present invention, there is provided a production method in which a first production line and a second production line each constituted by a plurality of facilities are provided, and in which a product is produced as a result of a plurality of processes. The first production line and the second production line are physically or geometrically discriminated from each other or discriminated as bodies corporate from each other, and are provided in places or regions remote from each other. In the first production line, works in process or half-finished products are produced in such a manner that a first identifier is attached to each of first substrates; process processing conditions with respect to each first substrate are assigned by being related to the first identifier; information on the processing conditions is stored in storage means; a group of some of the first substrates is accommodated in a carrier; a second identifier for identification of the group of first substrates is attached to the carrier; control information as the set of process processing conditions according to the first identifier is stored in the storage means; process progress information from the second identifiers and process processing information from the first identifiers are managed with an information processor; and a first element group is formed in each of a plurality of regions into which each first substrate is divided to thereby produce works on process or half-finished products. Also, first quality information or characteristic information about the first element group formed on each first substrate between particular process steps in the first process is collected by being related to the first identifier. In the second production line, each first substrate is divided into second substrates, and a group formed by some of the second substrates is treated as a second lot and processed by a second process to form a second element group in correspondence with each of a plurality of regions into which each second substrate is divided. Second quality information or characteristic information about the second element group or third quality information or product information about a state of the first element group and the second element group in which the first and second element groups are combined with each other between particular process steps in the second process is collected. The first quality information or characteristic information and the second quality information or characteristic information or the third quality information or product information are collated with each other. Information indicating addresses of some of the divisions identified as a nondefective in the second substrates is stored in the storage means. Each division is separated from the second substrates to form a unit functional member. Only functional members recognized as a nondefective from the information indicating the addresses are selected. Each selected functional member and at least one constituent member other than the functional member are combined into a module. A composite product in which this module is incorporated is produced.

The above-mentioned first element group is an active element group, an active elements on a substrate formed of active devices such as transistors or diodes. Typical examples of such a device group is a thin-film transistor (TFT) array on a substrate and a metal-insulator-metal (MIM) element array on a substrate. The second element group is electrooptical elements typified by liquid crystal elements, light-emitting elements typified by electroluminescence (EL) elements, or electron-source elements.

In the above-described arrangement of the present invention, the first production line is formed and operated on the basis of a production method licensed from a patent holder, and is constituted by a plurality of production facilities. A plurality of processing conditions can be set in the first production line. The second production line may exist as a production line in which a product licensed from a patent holder is used, which is constituted by a plurality of production facilities, and in which a plurality of processing conditions can be set.

Transport of works in process or half-finished products from the first production line to the second production line physically or geometrically discriminated from each other or discriminated as bodies corporate from each other and provided in places or regions remote from each other is performed in such a manner that a protective film for preventing breakdown in the first element group due to an environmental contamination or static electricity is formed, and the works in process or half-finished products are thereafter packed and transported. In the second production line, the protective film is removed to enable the works in process or half-finished products to be processed by the second process.

The first production line and the second production line provided as a production system for producing a composite product by a plurality of processes are physically or geometrically discriminated from each other or discriminated as bodies corporate from each other and are provided in places or regions remote from each other to prevent one of the two element groups from being contaminated by a constituent member in the other which causes a fault such as an abnormal operation, irreversible breakdown, short-circuiting, insulation, abnormal heat generation, offensive odor in the elements constituting the composite product. This arrangement also facilitates environmental contamination control in each production line, relaxes requirements in the specifications of air-conditioning equipment, filters accompanying the air-conditioning equipment, etc., extend the replacement cycle of consumables, and reduces power consumption in the factory where the production facilities are installed, thus facilitating facility management.

If the first substrate used in the first production line has a particular size, and if the second substrate used in the second production line has a particular size different from the size of the first substrate and determined by dividing the size of the first substrate, the sizes of the substrate can be optimized according to production techniques used in the first and second production lines. The optimum substrate size is determined by considering requirements with respect to theoretical factors in the manufacturing apparatuses, requirements with respect to process yields, requirements with respect to the processing capacity per unit time, etc.

In each production line, works in process for products are transported generally automatically. Works in processes are grouped in correspondence with the carriers and the process is advanced on a carrier-by-carrier basis. Ordinarily, multiple works in process are prepared and importance is attached to minimization of the wait time. Since each process step is advanced by recognizing each carrier as a unit, the wait time is considerably increased if the number of works in process grouped in each carrier is small, resulting in a reduction in productivity per unit time. To enable wide-variety small-lot production, a method is used in which an identifier such as a number, a symbol, a letter, a mark, a bar code, a block code, a color code, or a magnetic tape is used and assigned to each of first substrates, process processing conditions related to the identifier are input to storage means, one substrate of a set of a plurality of substrates is set as a group in one carrier, and information on the substrate set is stored in the storage means while being related to another identifier. Even if a plurality of lots exits in one holding frame, the existence of the plurality of lots can be recognized through the identifier, and processing conditions can be identified from the identifier attached to each work in process, thus enabling wide-variety small-lot production. Consequently, an increase in stock is prevented while the productivity is improved.

In the above-described arrangement of the present invention, the first production line is formed and operated on the basis of a production method licensed from a first patent holder and is constituted by a plurality of production facilities, and a plurality of processing conditions can be set in the first production line. The second production line may exist as a line in which a product licensed from the first patent holder is used, which is constituted by a plurality of production facilities, and in which plurality of processing conditions can be set. With respect to the second production line, the product provided as another component of a composite product may be added as a product licensed from a third patent holder by a method licensed from the third patent holder to complete the composite product. Thus, an element supported by an intellectual property right may be combined as each of essential factors or constituent members for a composite product to disperse a risk.

BRIEF DESCRIPTION OF THE DRAWINGS

In the accompanying drawings:

FIG. 5 is a schedule table showing an example of a production process in a first production line;

FIG. 6 is a schedule table showing an example of a production process in a second production line.

DESCRIPTION OF THE PREFERRED EMBODIMENT

Figure 1:
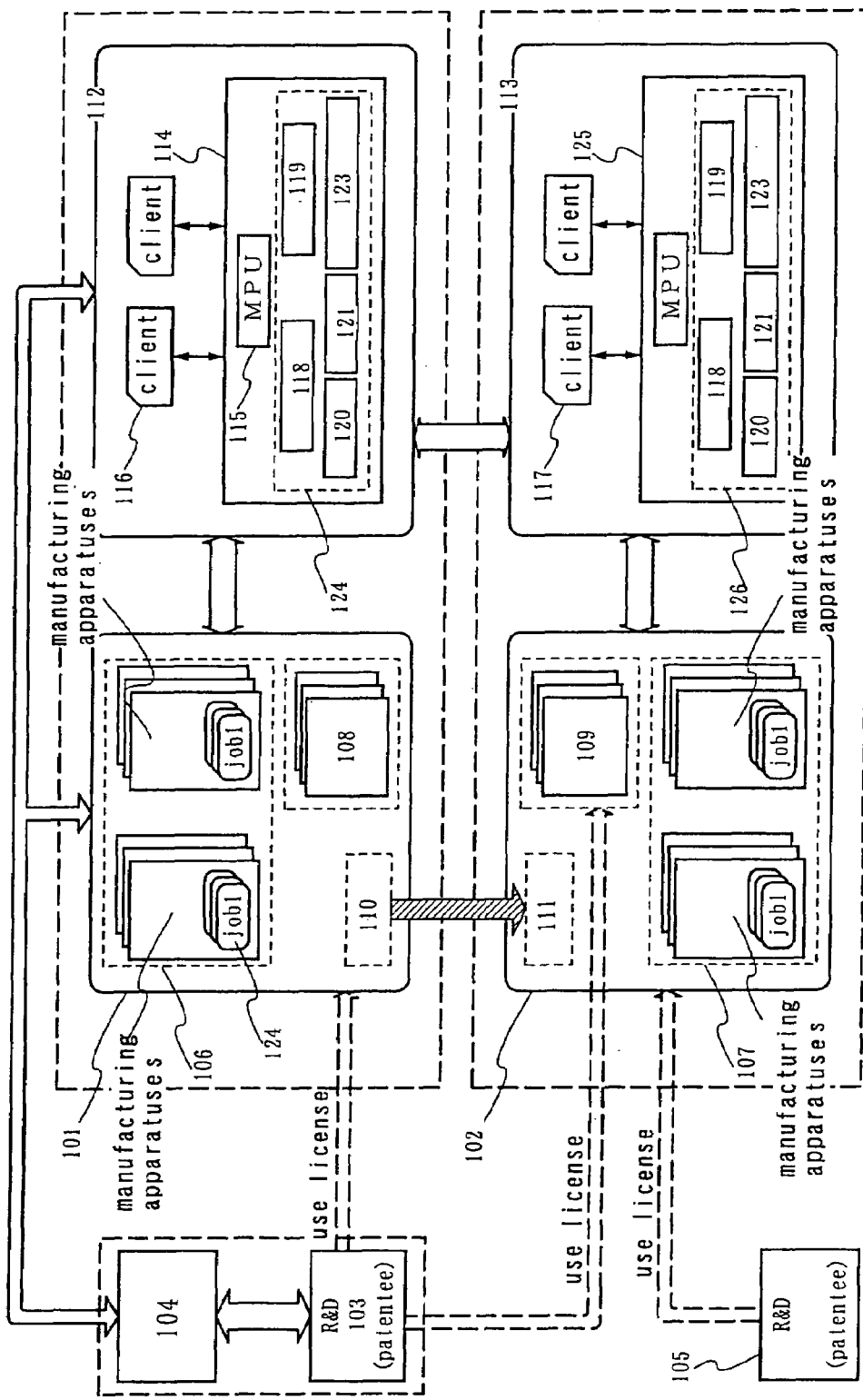
FIG. 1 is a diagram schematically showing the configuration of an example of a production system in accordance with the present invention.

An embodiment of the present invention will be described in detail with reference to the accompanying drawings. FIG. 1 shows the concept of a production system in accordance with the present invention. The production system of the present invention is suitable for production of a composite product in which a plurality of functional elements or functional materials having different constituents, constituent members or structures are combined, and includes a plurality of production lines suitable for the functional elements or functional materials. In FIG. 1, the interrelationship between a first production line 101 and a second production line 102 in the embodiment are illustrated. According to the present invention, there is no limit to the number of production lines interrelated. The first production line 101 and the second production line 102 are physically or geometrically discriminated from each other or discriminated as bodies corporate from each other and are installed in places or regions remote from each other.

The first production line 101 is constituted by a plurality of manufacturing apparatuses forming a manufacturing apparatus group 106. In the first production line 101, a plurality of processes can be continuously performed in parallel with each other. There are no particular restrictions on the constructions and specifications of the manufacturing apparatuses if the apparatuses are necessary for manufacturing the desired products.

A work 108 in process is on the first production line 101. There is no particular limitation on the selection of the kind or form of work 108 in process. If a composite product to be formed is an electronic appliance, a semiconductor substrate, a glass or quartz substrate, a printed circuit board or the like is provided as work 108 in process. A plurality of semiconductor elements are integrally formed on such a substrate to form an element group. For example, TFTs are arranged in matrix form to form a TFT panel or the like.

One work 108 in process or a plurality of works 108 in process are put on the production line while being treated as a group called a lot. An identifier is assigned to each work 108 in process (to each substrate) to enable each work 108 in process to be discriminated from others. An identifier is also assigned to a carrier for holding and moving one work 108 in process or one group of works 108 in process on the production line to enable the group to be discriminated from others. As each identifier having the above-described identification function, a number, a symbol, a letter, a mark, a bar code, a block code, a color code, or a magnetic tape may be used. Information borne on the identifier is read by an optical, magnetic, electrooptical, magnetooptical, or mechanical means.

An example of a first production control means 112 for production control or progress control in the first production line 101 is constituted by a client server system having a server (division and composition control system) 114 and a client (information collection input/output terminal) 116. The server 114 includes a microprocessor (MPU) 115 and a storage means 124. In the storage means 124 are recorded a schedule control table 118, process conditions 119, a lot organization 120, a lot configuration 121, quality characteristic information 123, etc. Processing for updating or changing these recording contents is performed at all times during a time period when the production line is in operation. The client 116 is constituted by input means such as a keyboard, a mouse, an image scanner and a code reader, output means such as a monitor and a printer, and storage means such as a hard disk. Needless to say, the production control means is not limited to such a client server system. The production control means may be constructed in a main frame, depending on the amount of information to be processed. If the scale of processing is small, the production control means may be constructed in a personal computer.

Figure 2:
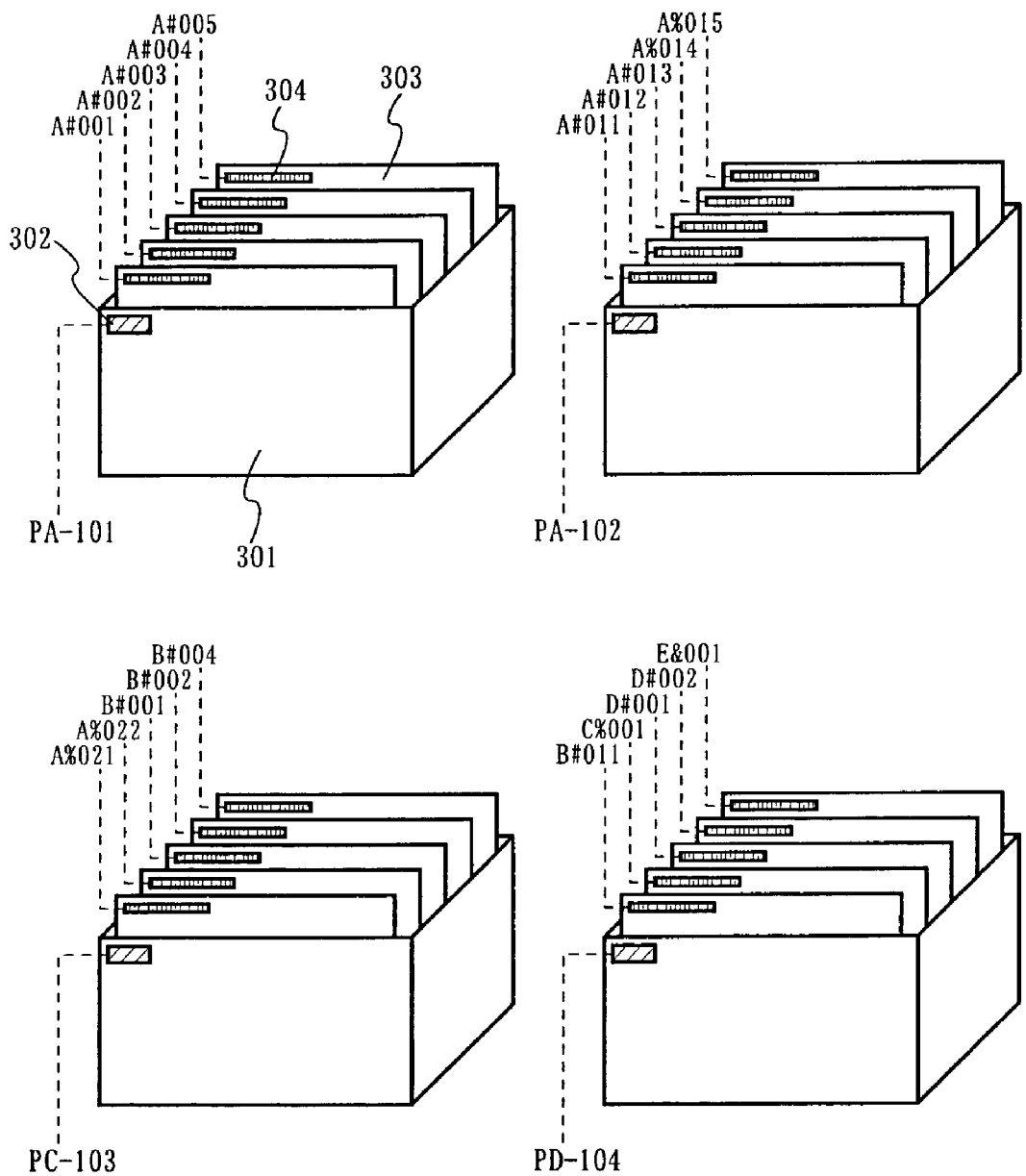
FIG. 2 is a diagram schematically showing an example of lot organization and use of identifiers for wide-variety small-lot production in accordance with the present invention.

A plurality of lots are put on the first production line 101 at all times in order that the drive efficiency of the manufacturing apparatus group 106 be increased to maximize the productivity. Schedule control with respect to the lots is performed by the first production control means 112 using identifiers for identification of the plurality of lots and the plurality of works 108 in process. FIG. 2 shows an example of identifiers for identification of lots and identifiers for identification of works in process. Works in process are held in a container or a frame called a carrier, which is used for movement of works in process between the manufacturing apparatuses. Referring to FIG. 2, a plurality of works 303 in process are held in a carrier 301, and first identifiers 304 are respectively attached to the works 303 in process. A number, a symbol, a letter, a mark, a bar code, a block code, a color code or the like can be used as identifier 304. A second identifier 302 is attached to the carrier 301 and is related to information on the works 303 in process held in the carrier 301.

A production unit called a lot may be organized with respect to each carrier or a plurality of lots may be contained in one carrier. Since in the production line works 303 in process are moved between the manufacturing apparatuses by this carrier 301 as described above, the process wait time is minimized if the loading capacity of the carrier 301 is maximized. Therefore maximization of the loading capacity of the carrier 301 contributes to maximization of the productivity.

Figure 3:
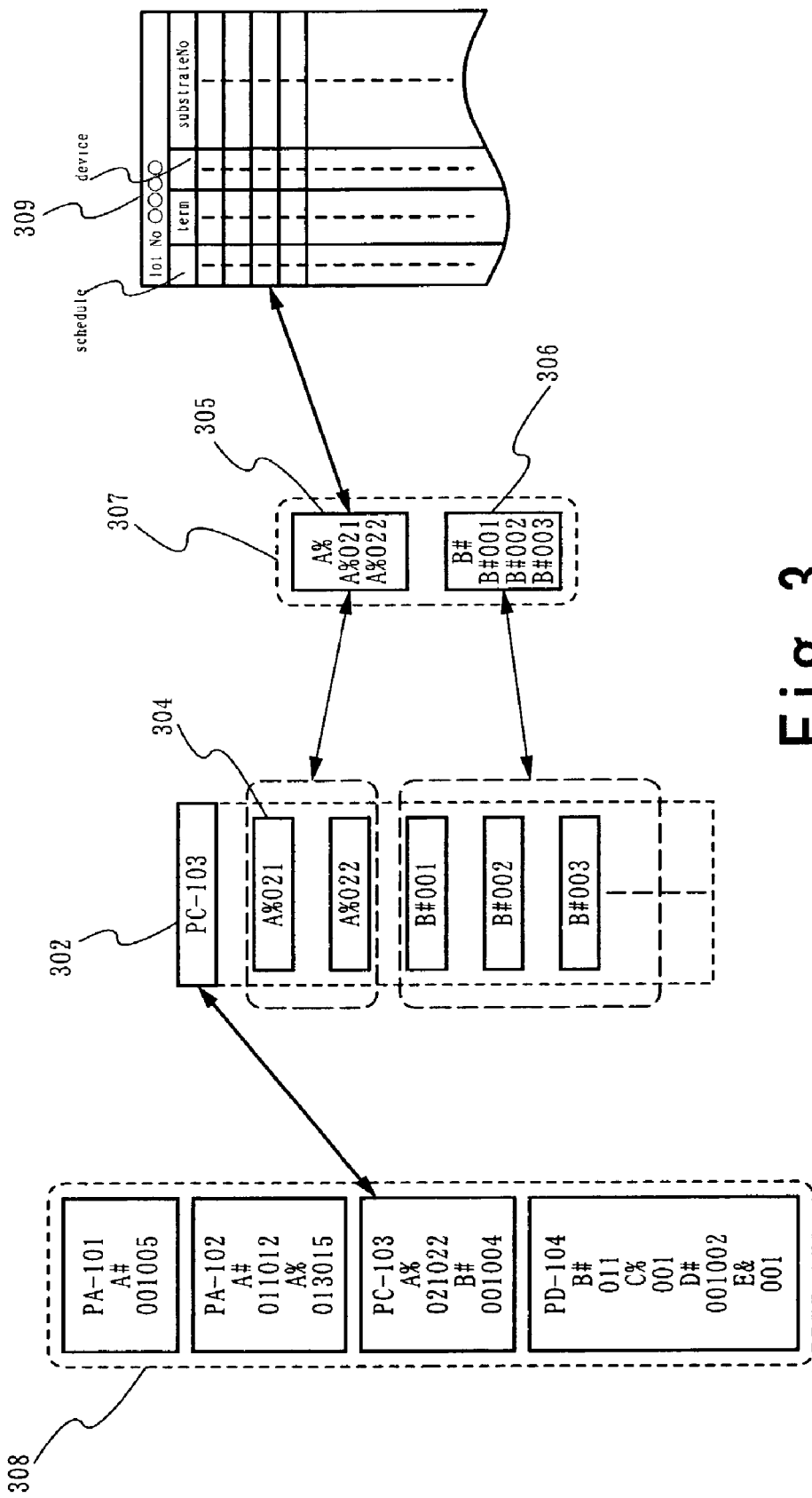
FIG. 3 is a diagram showing the interrelationship between lot organization information and identifiers for wide-variety small-lot production in accordance with the present invention.

FIG. 3 shows details of an example of the relationship between the first and second identifiers and the schedule control table 118, the process conditions 119, the lot organization 120, and the lot configuration 121 in the first process control system 112.

In the example shown in FIG. 3, at least two lots: a first lot 305 with a sign "A %" and a second lot 306 with a sign "B#" are contained in a carrier with the second identifier 302 attached thereto. Details of each lot are saved as data in a class referred to as lot configuration 307. The first identifier 304 is attached to each work in process. The lots may differ from each other in functions, characteristics, standard, size, kind of product, etc., according to the product specifications, and different process conditions can be set in correspondence with them. Process conditions 309 are prepared for each lot. In process conditions 309 for each lot, manufacturing conditions may be changed with respect to works in process. All the lots put on the production line are stored as data in a class referred to as lot organization 308.

Figure 4:
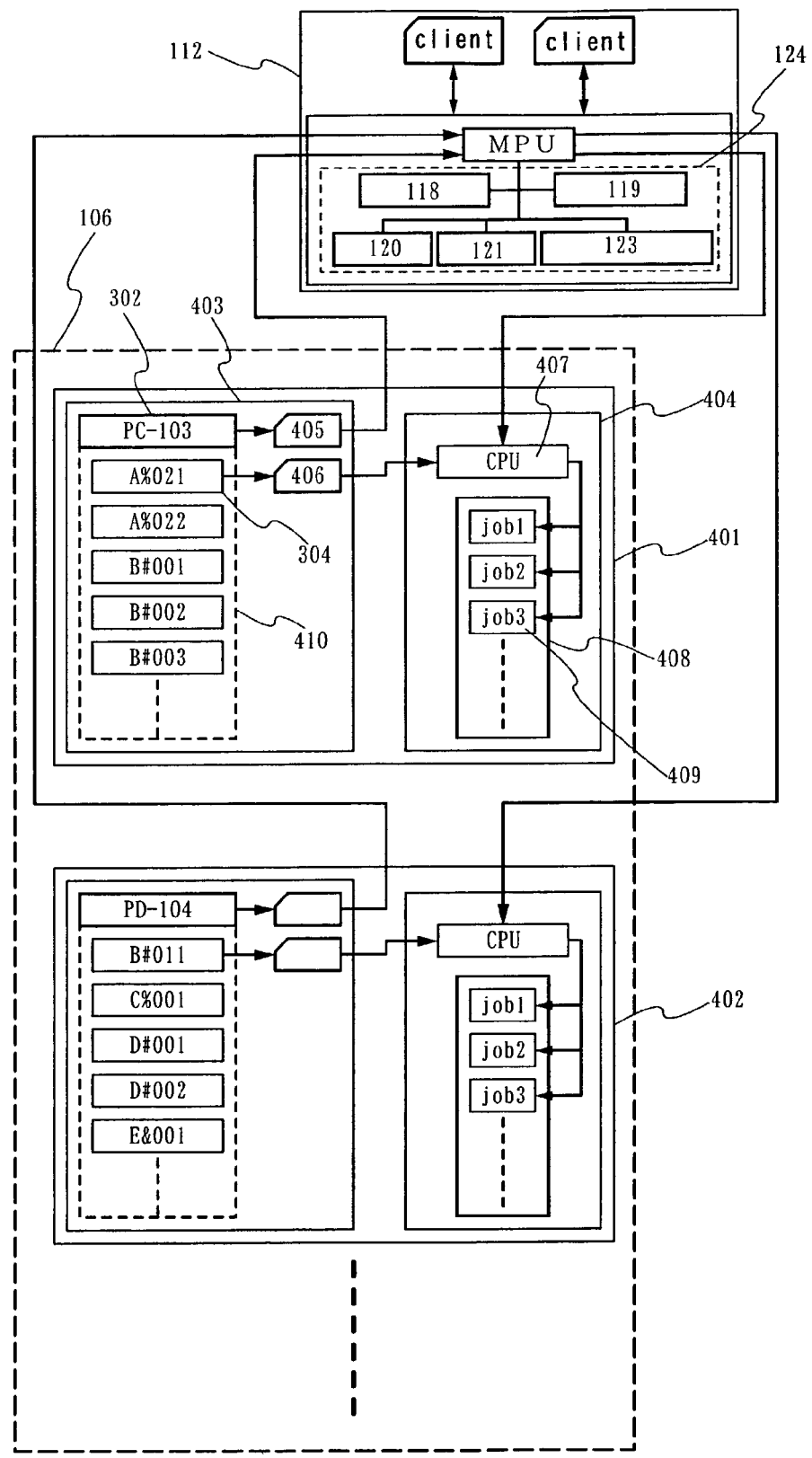
FIG. 4 is a diagram showing the configuration of a system for mutual information transmission between manufacturing apparatuses and production control means in a production line in accordance with the present invention.

FIG. 4 shows an example of use of identifiers in the production line. FIG. 4 shows essential components of the manufacturing apparatus group 106 and the first production control means 112 in the first production line. A manufacturing apparatus 401 is included in the manufacturing apparatus group 106. This manufacturing apparatus may be considered a combination of separate unit: a carrier station 403 which holds a carrier 410 moving in the production line, and a manufacturing apparatus main unit 404. A read means 405 for reading second identifier 302 and a read means 406 for reading first identifier 304 are provided in the carrier station 403. These read means are optical, magnetic, electrooptical, magnetooptical or mechanical means. Typically, a charge-coupled device (CCD) camera may be used as each read means.

Information recognized in the second identifier 302 on a lot by the read means 405 is sent to the first production control means 112 and is compared with data groups in the schedule control table, the process conditions, the lot organizations and the lot configurations stored in the storage means 124. Information from first identifiers 304 contained in the lot and information on the name of a process processing program corresponding to the first identifiers 304 are transmitted to the manufacturing apparatus 401. In the manufacturing apparatus 401, information is read from the first identifier 304 attached to one work in process by the read means 406, is sent to an MPU 407, and is compared with the above-mentioned information sent from the first production control means. A program 409 (e.g., job 1) for processing under predetermined processing conditions, which is stored in a storage means 408, is then read out and executed. A manufacturing apparatus 402 also has the same configuration. A plurality of manufacturing apparatuses of this configuration are arranged to form the manufacturing apparatus group 106. The manufacturing apparatuses similar in functions to each other and forming each apparatus group are placed in one area. The manufacturing apparatuses require utilities such as electricity, compressed air, cooling water, and exhaust ducts, and piping for supply of raw materials and submaterials. There is a need to efficiently install the equipment for these utilities, the ducts and the piping. This is the reason for the above-described placement of the manufacturing apparatuses.

As shown in FIGS. 1 through 4, centralized control on the production line can be performed by using first and second identifiers, managing information on process conditions, lot organizations and lot configurations, and by connecting the process control system and the manufacturing apparatuses by a local area network (LAN). While the information processing load on each manufacturing apparatus is reduced, multiple lots organized in a complicated manner or production units can be processed without being confused.

A manufacturing apparatus group 107, and a second process control system 113 constituted by a server 125, a storage means 126 and a client 117 in the second production line 102 shown in FIG. 1 may have the same configurations as the system and apparatuses in the first production line, and the detailed description for them will not be repeated.

In the first production lines 101 and the second production line 102, an inspection between particular processes is performed for quality control or quality assurance. For quality information or characteristic information based on an inspection between particular processes, a one hundred percent inspection with respect to all the works in process or a sampling inspection on each lot or at certain intervals is selectively performed according to a purpose. The first quality information or characteristic information collected in the first production lines 101 are stored in the storage means 124 in the first production control means 112 or in the storage means 126 in the second production control means 113 in correspondence with the first identifier and the second identifier. The second quality information or characteristic information collected in the second production lines 102 are stored in the storage means 124 of the first production control means 112 or in the storage means 126 of the second production control means 113 in correspondence with the first identifier and the second identifier. The information obtained by this inspection between processes may be first information on the quality or characteristics of components of the product added in the first production line 101, second information on the quality or characteristics of components of the product added in the second production line 102, or third information on the quality or product in composed conditions (the condition in which the first element group and the second element group are composed) of components added in the first and second production lines 101 and 102. This quality information or characteristic information can be shared between the first production control means 112 and the second production control means 113 in a state of being connected to each other by a communication line.

Works 108 in process shipped out of the first production line 101 may be newly organized into a second lot according to the specifications of the manufacturing apparatus group 107 provided in the second production line 102 by dividing the size of each work in process. Accordingly, the identifiers used in the first production line 101 may be used in the second production line 102 without being changed, or identifiers may be newly assigned if the size of each work is divided.

Transport of works in process or half-finished products between the first production line 101 and the second production line 102 is performed in such a manner that a protective film for preventing breakdown in a first element group due to an environmental contamination or static electricity is formed, and the works in process or half-finished products are thereafter packed and transported. The protective film is removed before the works in process or half-finished products undergo processing in the second production line 102. A shipping inspection is performed at the time of shipping from the first production line 101, and an arrival inspection is performed at the second production line 102. The shipping inspection and the arrival inspection are performed by inspection apparatuses identical in configuration to each other, and the inspection results of the two inspections are compared to check changes in quality during transport. These inspection results can also be used as information for obtaining a reasonable criterion for determination of the numbers of nondefectives in the shipped amount and the received amount.

After then, the products are produced as following:
collating the first quality information or characteristic information and the second quality information or characteristic information or the third quality information or characteristic information to form information indicating addresses of the divisions identified as nondefective in the second substrates;
separating each division from the second substrates to form a plurality of unit functional members;
selecting only functional members recognized as nondefective from the information indicating the addresses;
combining each selected functional member and at least one constituent member other than the functional member into a module; and
producing a product in which this module is incorporated.

Figure 7:
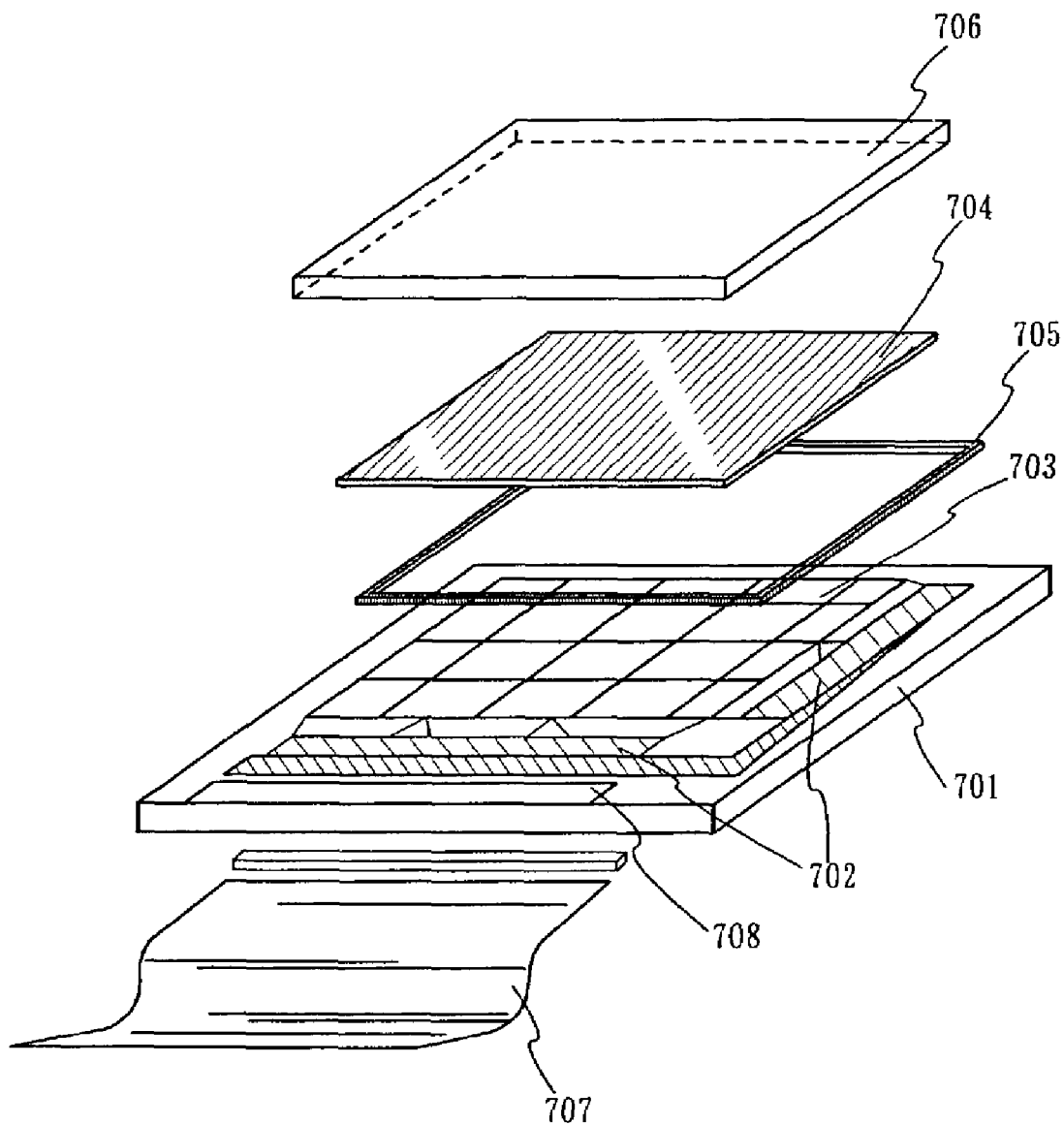
FIG. 7 is a diagram showing an example of the construction of a composite product.

FIG. 7 shows an example of an EL panel using a combination of a TFT panel having a glass or plastic substrate 701 on which first element groups 702 and 703 formed by TFTs are formed, and a display unit in which a second element group 704 formed by EL elements forms a pixel forming portion. The first element groups 702 and 703 formed by TFTs are manufactured in the first production line, while the second element group 704 formed by EL elements is manufactured in the second production line. FIGS. 5 and 6 show an example of the processes performed in the first and second production lines.

In the second production line, a sealing material 705 and a sealing plate 706 for forming the EL panel into a module are assembled and a flexible printed circuit (FPC) 707 to be connected to input terminals 703 is attached to the panel and is connected to an external circuit, thereby completing the module. This module is incorporated in an electronic appliance or an information device such as a portable telephone, a stationary telephone, a personal computer, and a personal digital assistant (PDA) to complete a composite product.

In manufacturing TFTs in such a composite product, there is a need to clean the manufacturing environment to prevent physical contamination with dust, chemical contamination with phosphorous, boron, an organic material gas or the like, chemical contamination with a metal or alkali metal, such as iron, nickel or sodium. On the other hand, the EL elements need to have an alkali metal or an alkali earth metal as its constituent. Thus, implementation of an integral production line for manufacturing such a composite product entails a conflict between such requirements, and a great deal of effort must be made to manufacture the product. In contrast, the first production line and the second production line are physically or geometrically discriminated from each other or discriminated as bodies corporate from each other and are installed in places or regions remote from each other to avoid such a problem.

The present invention is not limited to the above-described example of the combination of the first element group formed by TFTs and the second element group formed by EL elements in this embodiment. Any other combination of elements, e.g., a combination of a first element group formed by TFTs and a second element group formed by liquid crystal elements and a combination of a first element group formed by metal-insulator-metal (MIM) elements and a second element group formed by electron-source elements are possible.

The essential components forming a production line have been described. A research and development department and a design and trial manufacture department play important roles in developing, manufacturing and selling a composite product in a short period. The production system of the present invention includes such departments. A research and development department 103 shown in FIG. 3 develops new manufactures, and techniques in manufacturing methods, drive methods, etc., for the new manufactures, and obtains and holds industrial property rights, including patents, trademark rights and design rights. A design and trial manufacture department 104 performs mass-production trial manufacture by the newly-developed techniques, makes a reliability test, etc., on the trial product, and modifies the manufacturing apparatuses and process conditions in the first production line 101 on the basis of technical information obtained by the tests.

The research and development department 103, the design and trial manufacture department 104, the first production line 101 and the second production line 102 may be respectively owned by different bodies corporate. In such a case, the patents, etc., held by the research and development department 103 are utilized while being protected, as described below. The body corporate who owns the first production line is licensed with an ordinary or exclusive-use license to use production methods included in the patents held by the research and development department 103. The body corporate who owns the second production line is licensed with an ordinary or exclusive-use license to use products produced by the first production line. The development of improved products in the research and development department 103 is advanced by investing money obtained as licensing fees, thus speedily making research and development and providing market-leading composite products.

On the other hand, it is practically impossible to secure all industrial property rights relating to a composite products having functions increased in number and performance. For example, it is appropriate to bring in techniques relating to patented inventions from an external research and development institution 105 by setting an ordinary license or an exclusive-use license. If this procedure is used, the particular body corporate having the research and development department 103 and the design and trial manufacture department 104 can concentrate its capital in its best industrial field, while the bodies corporate having manufacturing lines can disperse risks.

The present invention has been described with respect to an embodiment thereof. However, the present invention can also be implemented in other various ways. It is easy for those skilled in the art to understand that the described embodiment, including its details, can be variously changed without departing from the scope and spirit of the invention. The contents of the description of the embodiment are not to be construed as limitations on the invention.

According to the present invention, the first production line and the second production line are physically or geometrically discriminated from each other or discriminated as bodies corporate from each other and are installed in places or regions remote from each other to prevent occurrence of defects in products due to contamination caused in the interrelated production lines.

In the first production line, works in process or half-finished products are produced in such a manner that a group of first substrates is treated as a first lot and processed by a first process to form a first element group in each of a plurality of regions into which each first substrate is divided. In the second production line, each first substrate is divided into second substrates, a group formed by some of the second substrates is treated as a second lot and processed by a second process to form a second element group in correspondence with each of a plurality of regions into which each second substrate is divided. The production system arranged in this manner can be used for wide-variety small-lot production with flexibility so as to cope with the increase in variety of products required on the market. Also, the research and development department and the production department may be formed as different bodies corporate to reduce the period from research and development to putting products on the market and to disperse risks relating to industrial property rights, etc.

According to the present invention, composite products using various combinations of elements, e.g., a composite product using a combination of a first element group formed by TFTs and a second element group formed by EL elements, a composite product using a combination of a first element group formed by TFTs and a second element group formed by liquid crystal elements, and a composite product using a combination of a first element group formed by MIM elements and a second element group formed by electron-source elements can be provided. Typical examples of such composite products are a liquid crystal display device and an EL display device.

What is claimed is:

1. A production system for a composite product that is provided with a plurality of facilities forming a production line in which a product is produced as a result of a plurality of processes, comprising:

a first production line which is formed by a plurality of production facilities, and a second production line formed by a plurality of production facilities, the first and second production lines being installed in places remote from each other, wherein the first production line is provided with a first manufacturing apparatus group formed by a plurality of manufacturing apparatuses, and first production control means for performing production control or progress control, the first production control means having first storage means for storing first quality information or characteristic information about a first element group formed on a first substrate in the first manufacturing apparatus group;

the second production line is provided with a second manufacturing apparatus group formed by a plurality of manufacturing apparatuses, and second production control means for performing production control or progress control with the first substrate divided into second substrates, the second production control means having second storage means for storing second quality information or characteristic information about a second element group formed on each second substrate in the second manufacturing apparatus group, or third quality information or product information relating to a state where the first element group and the second element group are combined;

the first production control means and the second production control means or the first storage means and the second storage means are capable of communicating the information with each other; and a function is provided in which the first quality information or characteristic information and the second quality information or characteristic information or the third quality information or characteristic information are collated with each other to ascertain an address of a division identified as nondefective in the second substrates.

2. A production system for a composite product that is provided with a plurality of facilities forming a production line in which a product is produced as a result of a plurality of processes, comprising:

a first production line which is formed based on a production method licensed from a patent holder, which is constituted by a plurality of production facilities, and in which a plurality of processing conditions can be set and a second production line using a product licensed from a patent holder, the first and second production lines being installed in places remote from each other, wherein the first production line is provided with a first manufacturing apparatus group formed by a plurality of manufacturing apparatuses, and first production control means for performing production control or progress control, the first production control means having first storage means for storing first quality information or characteristic information about a first element group formed on a first substrate in the first manufacturing apparatus group;

the second production line is provided with a second manufacturing apparatus group formed by a plurality of manufacturing apparatuses, and second production control means for performing production control or progress control with the first substrate divided into second substrates, the second production control means having second storage means for storing second quality information or characteristic information about a second element group formed on each second substrate in the second manufacturing apparatus group, or third quality information or product information relating to a state where the first element group and the second element group are combined;

the first production control means and the second production control means or the first storage means and the second storage means are capable of communicating the information with each other; and a function is provided in which the first quality information or characteristic information and the second quality information or characteristic information or the third quality information or characteristic information are collated with each other to ascertain an address of a division identified as nondefective in the second substrates.

3. A production method comprising:

treating a group of first substrates as a first lot in a first production line in accordance with a first process to form a first element group in each of a plurality of regions into which each of the first substrates is divided wherein said first production line is provided with a plurality of production facilities;

collecting at least one of first information about the first element group formed on each of the first substrates between particular process steps in the first process;

dividing each of the first substrates into second substrates in a second production line wherein said second production line is provided with a plurality of production facilities, the first and second production lines being installed in places remote from each other;

treating a group of the second substrates as a second lot in accordance with a second process to form a second element group in correspondence with each of a plurality of regions into which each of the second substrates is divided;

collecting second information about the second element group or third information about a composed state of the first element group and the second element group, between particular process steps in the second process;

collating the first information and the second information or the third information to form information indicating addresses of regions identified as nondefective in the second substrates;

separating respective regions from the second substrates to form a plurality of unit functional members;

selecting only functional members recognized as nondefective based on the information indicating the addresses;

combining each selected functional members and at least one constituent member other than the functional members into a module; and producing a product in which this module is incorporated.

4. A production method for a composite product according to claim 3, wherein the first information has first quality information or characteristic information, the second information has the second quality information or characteristic information and the third information has the third quality information or product information.

5. A production method comprising:

treating a group of first substrates as a first lot in a first production line in accordance with a first process to form a first element group in each of a plurality of regions into which each of the first substrates is divided wherein said first production line is provided with a plurality of production facilities;

collecting at least one of first information about the first element group formed on each of the first substrates between particular process steps in the first process;

forming on the first substrates a protective film for preventing the first element group from breaking due to an environmental contamination or static electricity;

transporting the first substrates from the first production line to a second production line wherein said second production line is provided with a plurality of production facilities, the first and second production lines being installed in places remote from each other;

dividing each of the first substrates into second substrates in the second production line;

treating a group of the second substrates as a second lot in accordance with a second process to form a second element group in correspondence with each of a plurality of regions into which each of the second substrates is divided;

collecting second information about the second element group or third information about a composed state of the first element group and the second element group, between particular process steps in the second process;

collating the first information and the second information or the third information to form information indicating addresses of regions identified as nondefective in the second substrates;

separating respective regions from the second substrates to form a plurality of unit functional members;

selecting only functional members recognized as nondefective based on the information indicating the addresses;

combining each selected functional members and at least one constituent member other than the functional members into a module; and producing a product in which this module is incorporated.

6. A production method for a composite product according to claim 5, wherein the first information has first quality information or characteristic information, the second information has the second quality information or characteristic information and the third information has the third quality information or product information.

7. A production method comprising:
attaching a first identifier to each of first substrates in a first production line wherein said first production line is provided with a plurality of production facilities;
accommodating a group of the first substrates in a carrier;
attaching a second identifier for identification of the group of the first substrates to the carrier;
in each of a plurality of regions into which each of the first substrates is divided, forming a first element group by a first process under a processing condition programmed according to the first and second identifiers;
collecting first information about the first element group formed on each of the first substrates between particular process steps in the first process in correspondence with the first identifier;
dividing each of the first substrates into second substrates in a second production line wherein said second production line is provided with a plurality of production facilities, the first and second production lines being installed in places remote from each other;
treating a group of the second substrates as a second lot in accordance with a second process to form a second element group in correspondence with each of a plurality of regions into which each of the second substrates is divided;
collecting second information about the second element group or third information about a composed state of the first element group and the second element group, between particular process steps in the second process;
collating the first information and the second information or the third information to form information indicating addresses of regions identified as nondefective in the second substrates;
separating respective regions from the second substrates to form a plurality of unit functional members;
selecting only functional members recognized as nondefective based on the information indicating the addresses;
combining each selected functional members and at least one constituent member other than the functional members into a module; and
producing a product in which this module is incorporated.

8. A production method for a composite product according to claim 7, wherein the first information has first quality information or characteristic information, the second information has the second quality information or characteristic information and the third information has the third quality information or product information.

9. A production method comprising:
attaching a first identifier to each of first substrates in a first production line;
accommodating a group of the first substrates in a carrier wherein said first production line is provided with a plurality of production facilities;
attaching a second identifier for identification of the group of the first substrates to the carrier;
in each of a plurality of regions into which each of the first substrates is divided, forming a first element group by a first process under a processing condition programmed according to the first and second identifiers;
collecting first quality information or characteristic information about the first element group formed on each of the first substrates between particular process steps in the first process by being related to the first identifier;
forming on the first substrates a protective film for preventing the first element group from breaking due to an environmental contamination or static electricity;
transporting the first substrates from the first production line to a second production line wherein said second production line is provided with a plurality of production facilities, the first and second production lines being installed in places remote from each other;
dividing each of the first substrates into second substrates in the second production line;
treating a group formed by the second substrates as a second lot to be processed by a second process after removing the protective film to form a second element group in correspondence with each of a plurality of regions into which each of the second substrates is divided;
collecting second information about the second element group or third information about a composed state of the first element group and the second element group, between particular process steps in the second process;
collating the first information and the second information or the third information to form information indicating addresses of regions identified as nondefective in the second substrates;
separating respective regions from the second substrates to form a plurality of unit functional members;
selecting only functional members recognized as nondefective based on the information indicating the addresses;
combining each selected functional members and at least one constituent member other than the functional members into a module; and
producing a product in which this module is incorporated.

10. A production method for a composite product according to claim 9, wherein the first information has first quality information or characteristic information, the second information has the second quality information or characteristic information and the third information has the third quality information or product information.

11. A production method comprising:
attaching a first identifier to each of first substrates in first a production line wherein said first production line is provided with a plurality of production facilities;
assigning process processing conditions with respect to each of the first substrates in the first identifier;
storing information on the processing conditions in storage means;
accommodating a group of the first substrates in a carrier;
attaching a second identifier for identification of the group of the first substrates to the carrier;
storing control information as a set of process processing conditions according to the first identifier in the storage means;
managing process progress information from the second identifiers and process processing information from the first identifiers with an information processor;
forming a first element group by a first process in each of a plurality of regions into which each of the first substrates is divided;
collecting first quality information or characteristic information about the first element group formed on each of the first substrates between particular process steps in the first process by being related to the first identifier to be stored in storage means;
dividing each of the first substrates into second substrates in a second production line wherein said second production line is provided with a plurality of production facilities, the first and second production lines being installed in places remote from each other;

treating a group of the second substrates as a second lot in accordance with a second process to form a second element group in correspondence with each of a plurality of regions into which each of the second substrates is divided;

collecting second information about the second element group or third information about a composed state of the first element group and the second element group, between particular process steps in the second process;

collating the first information and the second information or the third information to form information indicating addresses of regions identified as nondefective in the second substrates;

separating respective regions from the second substrates to form a plurality of unit functional members;

selecting only functional members recognized as nondefective based on the information indicating the addresses;

combining each selected functional members and at least one constituent member other than the functional members into a module; and producing a product in which this module is incorporated.

12. A production method for a composite product according to claim 11, wherein the first information has first quality information or characteristic information, the second information has the second quality information or characteristic information and the third information has the third quality information or product information.

13. A production method comprising:

attaching a first identifier to each of first substrates in a first production line wherein said first production line is provided with a plurality of production facilities;

assigning process processing conditions with respect to each of the first substrates in correspondence with the first identifier;

storing information on processing conditions in storage means;

accommodating a group of the first substrates in a carrier;

attaching a second identifier for identification of the group of the first substrates to the carrier;

storing control information as a set of process processing conditions according to the first identifier in the storage means;

managing process progress information from the second identifiers and process processing information from the first identifiers with an information processor;

forming a first element group by a first process in each of a plurality of regions into which each of the first substrates is divided;

collecting first information about the first element group formed on each of the first substrates between particular process steps in the first process by being related to the first identifier to be stored in storage means;

dividing each of the first substrates into second substrates in a second production line wherein said second production line is provided with a plurality of production facilities, the first and second production lines being installed in places remote from each other;

treating a group of the second substrates as a second lot in accordance with a second process to form a second element group in correspondence with each of a plurality of regions into which each of the second substrates is divided;

collecting second information about the second element group or third information about a composed state of the first element group and the second element group, between particular process steps in the second process;

collating the first information and the second information or the third information to form information indicating addresses of regions identified as nondefective in the second substrates;

separating respective regions from the second substrates to form a plurality of unit functional members;

selecting only functional members recognized as nondefective based on the information indicating the addresses;

combining each selected functional members and at least one constituent member other than the functional members into a module; and producing a product in which this module is incorporated.

14. A production method for a composite product according to claim 13, wherein the first information has first quality information or characteristic information, the second information has the second quality information or characteristic information and the third information has the third quality information or product information.

15. A production method comprising:

using a first production line which is formed based on a production method licensed from a patent holder, which is constituted by a plurality of production facilities, and to which a plurality of processing conditions are applicable, as processing in a first processing line wherein said first production line is provided with a plurality of production facilities;

treating a group of first substrates as a first lot in accordance with a first process to form a first element group in each of a plurality of regions into which each of the first substrates is divided;

collecting first information about a first element group formed on each of the first substrates between particular process steps in the first process;

using a product licensed from the patent holder formed by a plurality of processes to which a plurality of processing conditions are applicable in a second production line;

dividing each of the first substrates into second substrates in the second production line;

treating a group of the second substrates as a second lot in accordance with a second process to form a second element group in correspondence with each of a plurality of regions into which each of the second substrates is divided;

collecting second information about the second element group or third information about a composed state of the first element group and the second element group, between particular process steps in the second process;

collating the first information and the second information or the third information to form information indicating addresses of regions identified as nondefective in the second substrates;

separating respective regions from the second substrates to form a plurality of unit functional members;

selecting only functional members recognized as nondefective based on the information indicating the addresses;

combining each selected functional members and at least one constituent member other than the functional members into a module; and producing a product in which this module is incorporated.

16. A production method for a composite product according to claim 15, wherein the first information has first quality information or characteristic information, the second information has the second quality information or characteristic information and the third information has the third quality information or product information.

17. A production method comprising:
using a first production line which is formed based on a production method licensed from a patent holder, which is constituted by a plurality of production facilities, and to which a plurality of processing conditions are applicable, as processing in a first processing line wherein said first production line is provided with a plurality of production facilities;
treating a group of first substrates as a first lot in accordance with a first process to form a first element group in each of a plurality of regions into which each of the first substrates is divided;
collecting first information about a first element group formed on each of the first substrates between particular process steps in the first process;
forming on the first substrates a protective film for preventing the first element group from breaking due to an environmental contamination or static electricity;
transporting the first substrates from the first production line to a second production line;
using a product licensed from the patent holder formed by a plurality of processes to which a plurality of processing conditions are applicable in the second production line;
dividing each of the first substrates into second substrates in the second line;
treating a group of the second substrates as a second lot in accordance with a second process after removing the protective film to form a second element group in correspondence with each of a plurality of regions into which each of the second substrates is divided;
collecting, in a process thereof, second information about the second element group or third information about a composed state of the first element group and the second element group, between particular process steps in the second process;
collating the first information and the second information or the third information to form information indicating addresses of regions identified as nondefective in the second substrates;
separating respective regions from the second substrates to form a plurality of unit functional members;
selecting only functional members recognized as nondefective based on the information indicating the addresses;
combining each selected functional members and at least one constituent member other than the functional members into a module; and
producing a product in which this module is incorporated.

18. A production method for a composite product according to claim 17, wherein the first information has first quality information or characteristic information, the second information has the second quality information or characteristic information and the third information has the third quality information or product information.

19. A production method comprising:
using a first production line which is formed based on a production method licensed from a patent holder, which is constituted by a plurality of production facilities, and to which a plurality of processing conditions are applicable, as processing in a first processing line wherein said first production line is provided with a plurality of production facilities;
attaching a first identifier to each of first substrates;
accommodating a group of the first substrates in a carrier;
attaching a second identifier for identification of the group of the first substrates to the carrier;
producing, by a first process under a processing condition, a product in which a first device group is formed in each of a plurality of regions into which each first substrate is divided, the process and the processing conditions being programmed according to the first and second identifiers;
collecting first information about the first device group formed on each of the first substrates between particular process steps in the first process while the product is being formed, the method also using a second production line in which a product licensed from a patent holder is used, which is constituted by a plurality of production facilities, and to which a plurality of processing conditions are applicable, the method comprising, as processing in the second processing line;
dividing each of the first substrates into second substrates;
treating as a second lot a group formed by the second substrates;
processing the group of the second substrates by a second process to form a second device group in correspondence with each of a plurality of regions into which each of the second substrates is divided;
collecting, in a process thereof, second information about the second element group or third information about a composed state of the first element group and the second element group, between particular process steps in the second process;
collating the first information and the second information or the third information to form information indicating addresses of regions identified as nondefective in the second substrates;
separating respective regions from the second substrates to form a plurality of unit functional members;
selecting only functional members recognized as nondefective based on the information indicating the addresses;
combining each selected functional members and at least one constituent member other than the functional members into a module; and
producing a product in which this module is incorporated.

20. A production method for a composite product according to claim 19, wherein the first information has first quality information or characteristic information, the second information has the second quality information or characteristic information and the third information has the third quality information or product information.

21. A production method comprising:
using a first production line which is formed based on a production method licensed from a patent holder, which is constituted by a plurality of production facilities, and to which a plurality of processing conditions are applicable, as processing in a first processing line;
attaching a first identifier to each of first substrates;
accommodating a group of the first substrates in a carrier;
attaching a second identifier for identification of the group of the first substrates to the carrier;
producing, by a first process under a processing condition, a product in which a first element group is formed in each of a plurality of regions into which each first substrate is divided, the process and the processing conditions being programmed according to the first and second identifiers;

collecting first information about the first element group formed on each first substrate between particular process steps in the first process while the product is being formed;

forming on the first substrates a protective film for preventing the first element group from breaking due to an environmental contamination or static electricity;

transporting the first substrates from the first production line to a second production line;

using the second production line in which a product licensed from a patent holder is used, which is constituted by a plurality of production facilities, and in which a plurality of processing conditions can be set, the method comprising, as processing in the second processing line;

dividing each of the first substrates into second substrates;

treating as a second lot a group formed by the second substrates;

processing the group of the second substrates by a second process after removing the protective film to form a second element group in correspondence with each of a plurality of regions into which each second substrate is divided;

collecting, in a process thereof, second information about the second element group or third information about a composed state of the first element group and the second element group, between particular process steps in the second process;

collating the first information and the second information or the third information to form information indicating addresses of regions identified as nondefective in the second substrates;

separating respective regions from the second substrates to form a plurality of unit functional members;

selecting only functional members recognized as nondefective based on the information indicating the addresses;

combining each selected functional members and at least one constituent member other than the functional members into a module; and producing a product in which this module is incorporated.

22. A production method for a composite product according to claim 21, wherein the first information has first quality information or characteristic information, the second information has the second quality information or characteristic information and the third information has the third quality information or product information.

23. A production method comprising:

using a first production line which is formed based on a production method licensed from a patent holder, which is constituted by a plurality of production facilities, and to which a plurality of processing conditions are applicable, as processing in a first processing line;

attaching a first identifier to each of first substrates;

assigning process processing conditions with respect to each first substrate by relating the process processing conditions to the first identifier;

storing information on the processing conditions in storage means;

accommodating a group of the first substrates in a carrier;

attaching a second identifier for identification of the group of the first substrates to the carrier;

storing control information as a set of process processing conditions according to the first identifier in the storage means managing process progress information from the second identifiers and process processing information from the first identifiers with an information processor;

producing a product in which a first device group is formed by a first process in each of a plurality of regions into which each of the first substrates is divided; and collecting first information about the first device group formed on each of the first substrates between particular process steps in the first process;

storing the first information in the storage means by relating the information to the first identifier;

using a second production line in which a product licensed from a patent holder is used, which is constituted by a plurality of production facilities, and to which a plurality of processing conditions are applicable, the method comprising, as processing in the second processing line;

dividing each of the first substrates into second substrates in the second production line;

treating a group of the second substrates as a second lot in accordance with a second process to form a second element group in correspondence with each of a plurality of regions into which each of the second substrates is divided;

collecting second information about the second element group or third information about a composed state of the first element group and the second element group, between particular process steps in the second process;

collating the first information and the second information or the third information to form information indicating addresses of regions identified as nondefective in the second substrates;

separating respective regions from the second substrates to form a plurality of unit functional members selecting only functional members recognized as nondefective based on the information indicating the addresses;

combining each selected functional members and at least one constituent member other than the functional members into a module; and producing a product in which this module is incorporated.

24. A production method for a composite product according to claim 23, wherein the first information has first quality information or characteristic information, the second information has the second quality information or characteristic information and the third information has the third quality information or product information.

25. A production method comprising:

using a first production line which is formed based on a production method licensed from a patent holder, which is constituted by a plurality of production facilities, and to which a plurality of processing conditions are applicable, as processing in a first processing line;

attaching a first identifier to each of first substrates;

assigning process processing conditions with respect to each of the first substrates by relating the process processing conditions to the first identifier;

storing information on the processing conditions in storage means;

accommodating a group of the first substrates in a carrier;

attaching a second identifier for identification of the group of the first substrates to the carrier;

storing control information as a set of process processing conditions according to the first identifier in the storage means;

managing process progress information from the second identifiers and process processing information from the first identifiers with an information processor;

producing a product in which a first element group is formed by a first process in each of a plurality of regions into which each of the first substrates is divided;

collecting first quality information or characteristic information about the first element group formed on each of the first substrates between particular process steps in the first process, and storing the collected information in the storage means by relating the information to the first identifier;

forming on the first substrates a protective film for preventing the first element group from breaking due to an environmental contamination or static electricity;

transporting the first substrates from the first production line to a second production line;

using the second production line in which a product licensed from a patent holder is used, which is constituted by a plurality of production facilities, and in which a plurality of processing conditions can be set, the method comprising, as processing in the second processing line;

dividing each of the first substrates into second substrates;

treating as a second lot a group formed by the second substrates;

processing the group of the second substrates by a second process after removing the protective film to form a second element group in correspondence with each of a plurality of regions into which each second substrate is divided;

collecting second information about the second element group or third information about a composed state of the first element group and the second element group, between particular process steps in the second process;

collating the first information and the second information or the third information to form information indicating addresses of regions identified as nondefective in the second substrates;

separating respective regions from the second substrates to form a plurality of unit functional members;

selecting only functional members recognized as nondefective based on the information indicating the addresses;

combining each selected functional members and at least one constituent member other than the functional members into a module; and producing a product in which this module is incorporated.

26. A production method for a composite product according to claim 25, wherein the first information has first quality information or characteristic information, the second information has the second quality information or characteristic information and the third information has the third quality information or product information.

* * * * *